(12) United States Patent
Oh et al.

(10) Patent No.: US 12,740,470 B2
(45) Date of Patent: Sep. 15, 2026

(54) SEMICONDUCTOR PACKAGE MANUFACTURING METHOD AND SEMICONDUCTOR PACKAGE

(71) Applicant: SAMSUNG ELECTRONICS CO., LTD., Suwon-si (KR)

(72) Inventors: Seungchul Oh, Suwon-si (KR); Junwoo Myung, Suwon-si (KR); Jangbae Son, Suwon-si (KR); Gun Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 394 days.

(21) Appl. No.: 18/323,680

(22) Filed: May 25, 2023

(65) Prior Publication Data

US 2024/0145326 A1 May 2, 2024

(30) Foreign Application Priority Data

Oct. 27, 2022 (KR) ........................ 10-2022-0139820

(51) Int. Cl.

| | |
|---|---|
| ***H10W 74/10*** | (2026.01) |
| ***H10W 42/00*** | (2026.01) |
| ***H10W 70/685*** | (2026.01) |
| ***H10W 74/01*** | (2026.01) |
| ***H10W 90/00*** | (2026.01) |

(52) U.S. Cl.

CPC ........ *H10W 74/117* (2026.01); *H10W 42/121* (2026.01); *H10W 70/685* (2026.01); *H10W 74/019* (2026.01); *H10W 74/121* (2026.01); *H10W 90/724* (2026.01)

(58) Field of Classification Search

CPC ............. H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/3185; H01L 23/3157; H01L 21/56; H01L 21/563; H01L 21/568; H01L 23/5389; H01L 24/23–25; H01L 24/82; H01L 2224/82–82986; H05K 1/185; H10W 42/121; H10W 74/00–481

See application file for complete search history.

(56) References Cited

U.S. PATENT DOCUMENTS

| | | | |
|---|---|---|---|
| 7,229,852 | B2 | 6/2007 | Hoshika |
| 9,093,489 | B2 | 7/2015 | Yu et al. |

(Continued)

FOREIGN PATENT DOCUMENTS

| | | | |
|---|---|---|---|
| JP | 2006-059992 | A | 3/2006 |
| KR | 20080093759 | A | 10/2008 |

(Continued)

*Primary Examiner* — Wael M Fahmy
*Assistant Examiner* — Quinton A Brasfield
(74) *Attorney, Agent, or Firm* — Wolf, Greenfield & Sacks, P.C.

(57) ABSTRACT

A method of manufacturing a semiconductor package includes adding an insulating frame to a surface of a carrier substrate, wherein the insulating frame covers a side surface of a first metal layer on the surface of the carrier substrate and bringing a cover insulating layer into contact with the insulating frame and the first metal layer, wherein the cover insulating layer covers at least one semiconductor chip.

20 Claims, 12 Drawing Sheets

(56) References Cited

U.S. PATENT DOCUMENTS

| | | | | |
|---|---|---|---|---|
| 9,099,512 | B2 | 8/2015 | Flaim et al. | |
| 2011/0097850 | A1 | 4/2011 | Hsu | |
| 2012/0324723 | A1 | 12/2012 | Hong et al. | |
| 2013/0243995 | A1 | 9/2013 | Kim et al. | |
| 2018/0337135 | A1 | 11/2018 | Yoshihiro et al. | |
| 2020/0211938 | A1* | 7/2020 | Park | H10W 70/461 |
| 2020/0312801 | A1* | 10/2020 | Ko | H10P 72/74 |
| 2021/0265251 | A1* | 8/2021 | Mun | H10W 70/685 |
| 2021/0407924 | A1* | 12/2021 | Lee | H10P 72/74 |
| 2022/0068818 | A1* | 3/2022 | Song | H10W 70/611 |

FOREIGN PATENT DOCUMENTS

| | | | |
|---|---|---|---|
| KR | 10-2019-0088699 | A | 7/2019 |
| KR | 10-2020-0114314 | A | 10/2020 |

* cited by examiner 200c-6

SEMICONDUCTOR PACKAGE MANUFACTURING METHOD AND SEMICONDUCTOR PACKAGE

CROSS-REFERENCE TO RELATED APPLICATION(S)

This application claims benefit of priority to Korean Patent Application No. 10-2022-0139820, filed on Oct. 27, 2022 in the Korean Intellectual Property Office, the disclosure of which is incorporated herein by reference in its entirety.

BACKGROUND

The present inventive concept relates to a semiconductor package manufacturing method and a semiconductor package.

In general, semiconductor chips may be implemented as semiconductor packages, such as wafer level packages (WLP) or panel level packages (PLP), and the semiconductor packages may be used as electronic components of devices.

A semiconductor package may include a redistribution layer for electrically connecting a semiconductor chip to a device or to a printed circuit board (PCB). The redistribution layer may have a structure in which redistributions finer than wirings of a wiring layer of a general PCB are horizontally extended.

The redistribution layer may be electrically connected to bumps to vertically extend an electrical connection path, and under bump metallurgy (UBM) may improve efficiency of electrical connection between the redistribution layer and the bumps.

As such, a process of manufacturing a semiconductor package may be accompanied by a plurality of pieces of equipment (e.g., equipment for arranging semiconductor chips, equipment for forming a redistribution layer, and equipment for forming bumps/UBMs). Accordingly, semiconductor packages being manufactured may be accompanied by movement between pieces of equipment. A carrier may be moved by pieces of equipment, in a state of being disposed on an upper or lower surface of the semiconductor package being manufactured.

SUMMARY

An aspect of the present inventive concept is to a semiconductor package manufacturing method and a semiconductor package capable of improving efficiency related to a carrier implemented to be resistant to physical contact with external structures (e.g., adjacent equipment).

According to an aspect of the present inventive concept, a method of manufacturing a semiconductor package may include adding an insulating frame to a surface of a carrier substrate, wherein the insulating frame covers a side surface of a first metal layer on the surface of the carrier substrate; and bringing a cover insulating layer into contact with the insulating frame and the first metal layer, wherein the cover insulating layer covers at least one semiconductor chip.

According to another aspect of the present inventive concept, a semiconductor package may include a redistribution structure having at least one redistribution layer and at least one redistribution insulating layer alternately stacked; a semiconductor chip on an upper surface of the redistribution structure and electrically connected to the at least one redistribution layer; and a cover insulating layer on the upper surface of the redistribution structure and contacting and covering a side surface of the semiconductor chip, wherein the cover insulating layer is configured as a single build-up film layer.

According to another aspect of the present inventive concept, a semiconductor package may include a redistribution structure having at least one redistribution layer and at least one redistribution insulating layer alternately stacked; a semiconductor chip on an upper surface of the redistribution structure and electrically connected to the at least one redistribution layer; a cover insulating layer on the upper surface of the redistribution structure and contacting and covering a side surface of the semiconductor chip, and an insulating material partially contacting a portion of an outer surface of the cover insulating layer and partially contacting a portion of an upper surface of the cover insulating layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1A:
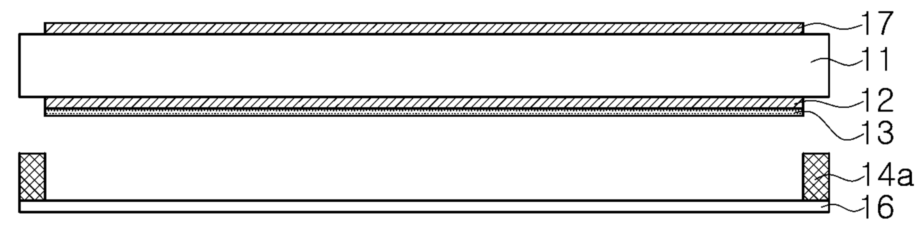
FIGS. 1A and 1B are cross-sectional views illustrating an operation of adding an insulating frame to one surface of a carrier substrate in a method of manufacturing a semiconductor package according to an embodiment of the present inventive concept.

In the following detailed description, reference is made to the accompanying drawings that show, by way of illustration, particular embodiments in which the invention may be practiced. These embodiments are described in sufficient detail to enable those skilled in the art to practice the invention. It is to be understood that the various embodiments of the invention, although different, are not necessarily mutually exclusive. For example, a certain feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Hereinafter, embodiments will be described in detail with reference to the accompanying drawings such that they may be easily practiced by those skilled in the art to which the present invention pertains.

Figure 1B:
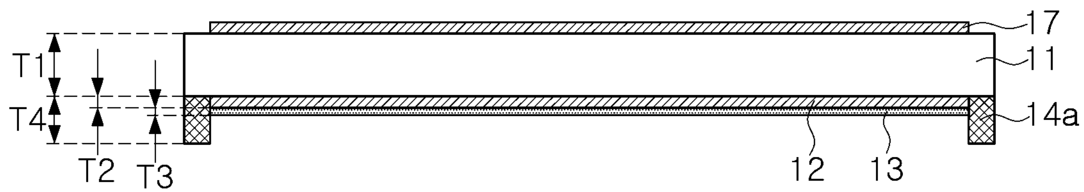

Referring to FIGS. 1A and 1B, a method of manufacturing a semiconductor package according to an embodiment of the present inventive concept may include an operation of adding an insulating frame 14*a* covering a side surface of a first metal layer 13 disposed on one surface (e.g., a lower surface) of a carrier substrate 11 to one surface of the carrier substrate 11.

A carrier 10*a*-1 may include a carrier substrate 11 and a first metal layer 13. For example, the carrier 10*a*-1 may be a detachable copper foil (DCF) carrier. In this case, the carrier substrate 11 may include prepreg. The DCF carrier may be advantageous in reducing a possibility of warpage of a semiconductor package being manufactured. Reducing the possibility of warpage of the semiconductor package may be more important when a horizontal size of the semiconductor package is relatively larger, such as a fan-out panel level package (FO-PLP). Rigidity of the carrier substrate 11 may be stronger as a thickness T1 of the carrier substrate 11 is greater, and the thickness T1 of the carrier substrate 11 may be greater than the sum of thicknesses T3 and T2 of the first and second metal layers 13 and 12.

For example, the carrier 10*a*-1 may further include the second metal layer 12 disposed between the carrier substrate 11 and the first metal layer 13, and may further include a third metal layer 17 disposed on the other surface (e.g., an upper surface) of the carrier substrate 11. Since the carrier substrate 11 may be removed from a finished semiconductor package, the first metal layer 13 and the second metal layer 12 may be adhered to each other so that the carrier substrate 11 may be easily removed. For example, an organic release layer having a thickness of about 20 nm may be disposed between the first and second metal layers 13 and 12 as an adhesive for the first and second metal layers 13 and 12.

For example, each of the first and second metal layers 13 and 12 may be a single metal layer including copper. The thickness T3 of the first metal layer 13 may be greater than 1 μm and less than 10 μm (e.g., 5 μm), and the thickness T2 of the second metal layer 12 may be greater than the thickness T3 of the first metal layer 13 and may be 10 μm or more and less than 30 μm (e.g., 18 μm), but is not limited thereto.

However, the carrier 10*a*-1 is not limited to the DCF carrier. For example, the carrier substrate 11 may include glass instead of prepreg, and each of the first and second metal layers 13 and 12 may include titanium (Ti). Alternatively, an additional metal layer including titanium may be additionally disposed on upper or lower surfaces of each of the first and second metal layers 13 and 12. The carrier including glass may be advantageous in reducing each of the thicknesses T3 and T2 of the first and second metal layers 13 and 12 to less than 1 μm.

One surface (e.g., a lower surface) of the carriers 10*a*-1 and 10*a*-2 may provide a region on which the semiconductor package being manufactured is temporarily disposed (i.e., the semiconductor package is located on the region), and the carriers 10*a*-1 and 10*a*-2 may be moved by equipment in a state in which the semiconductor package is disposed thereon. At this time, a physical situation (e.g., a collision) with respect to an external structure (e.g., adjacent equipment) may be applied to a side surface of the first metal layer 13, and the side surface of the first metal layer 13 may be unintentionally separated from the carrier substrate 11 if the side surface of the first metal layer 13 is not covered by the insulating frame 14*a*.

In other words, the insulating frame 14*a* may cover the side surface of the first metal layer 13 to prevent the first metal layer 13 from being unintentionally separated from the carrier substrate 11. The insulating frame 14*a* may horizontally surround (i.e., extend around) the first metal layer 13 and may not overlap the first metal layer 13 in a vertical direction. Accordingly, the carrier 10*a*-2 may be implemented to be resistant to physical situations with respect to external structures (e.g., adjacent equipment). That is, the carrier 10*a*-2 is protected from contact, collisions, etc., with other components and equipment.

Since the lower surface of the first metal layer 13 may be flat, a region in which a semiconductor package being manufactured is directly disposed may be provided. Therefore, a separate passivation insulating layer may not be formed on the lower surface of the first metal layer 13, and an insulating material (e.g., the same as the insulating material of the insulating frame 14*a*) that may be included in the separate passivation insulating layer may be saved. That is, the insulating frame 14*a* may efficiently cover the side surface of the first metal layer 13, while having a relatively small volume. Also, an increase of a total thickness of the semiconductor package due to a separate passivation insulating layer may be prevented.

For example, the operation of adding the insulating frame 14*a* to one surface of the carrier substrate 11 may include adding the insulating frame 14*a* to one surface of the carrier substrate 11 so that a side surface of the second metal layer 12 disposed between the carrier substrate 11 and the first metal layer 13. Accordingly, it is possible to prevent the first and second metal layers 13 and 12 from being unintentionally separated from each other due to collisions of external structures (e.g., adjacent equipment).

For example, the operation of adding the insulating frame 14*a* to one surface of the carrier substrate 11 may include forming the insulating frame 14*a* on one surface (e.g., an upper surface) of a plate 16 and moving the plate 16 and the carrier substrate 11 to be close to each other and disposing the insulating frame 14*a* on the side surface of the first metal layer 13. In this method, the insulating frame 14*a* may have the thickness T4 greater than the sum of the thicknesses T3 and T2 of the first and second metal layers 13 and 12 and may be advantageous not to vertically overlap the first and second metal layers 13 and 12 (i.e., the insulating frame 14*a* only contacts the side surfaces of the first and second metal layers 13 and 12 and does not overlie/contact the lower surface of either the first and second metal layers 13 and 12).

Generally, since an insulating material before an insulating structure is completed may have fluidity, the insulating frame 14*a* may be formed in a specific shape (e.g., a frame shape) on one surface of the plate 16. For example, in a state in which a layer (e.g., a photoresist layer) thicker than the first and second metal layers 13 and 12 is formed on one surface of the plate 16, an insulating material (e.g., a build-up film) may be formed to surround the layer, and the layer may be removed. Alternatively, an insulating material (e.g., a build-up film) may be applied to the entire region on one surface of the plate 16, and then a central portion of the insulating material may be removed. For example, the plate 16 may be a thermoplastic film, such as PET (polyester) film.

Figure 1C:
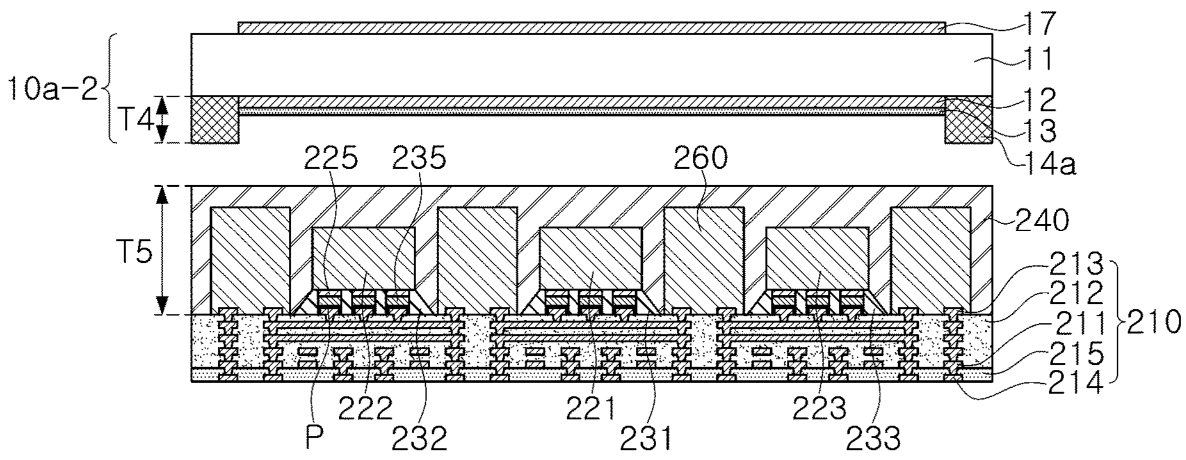
FIGS. 1C and 1D are cross-sectional views illustrating an operation of contacting a cover insulating layer to an insulating frame and a first metal layer in a method of manufacturing a semiconductor package according to an embodiment of the present inventive concept.
Figure 1D:
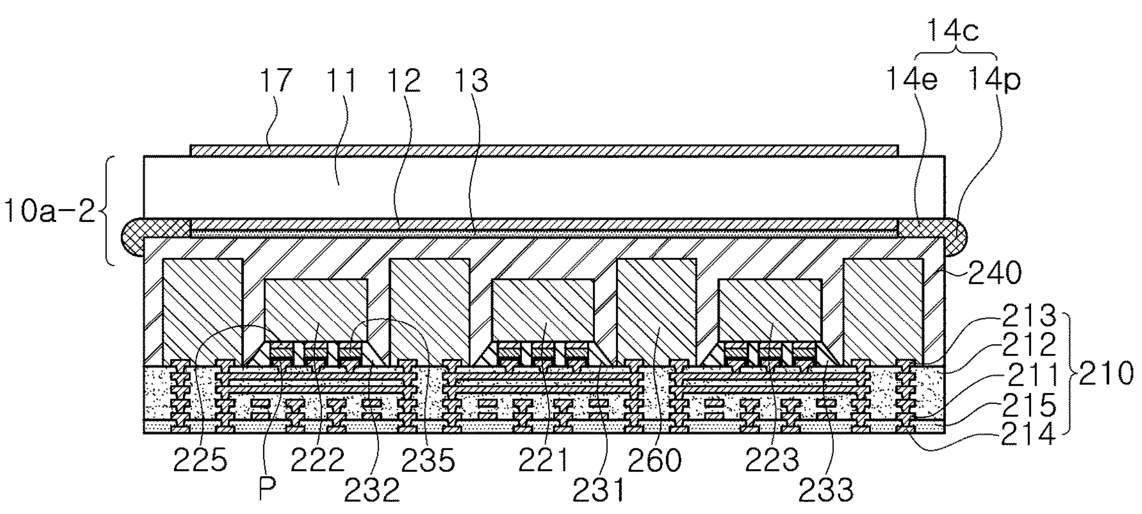

Referring to FIGS. 1C and 1D, semiconductor packages 200*a*-6 and 200*a*-7 being manufactured may include at least some of a redistribution structure 210, at least one semiconductor chip 221, 222, and 223 and a core member 260. FIGS. 1C and 1D illustrate that the cover insulating layer 240 contacts the insulating frame 14*a* in a state in which at least one semiconductor chip 221, 222, and 223 is disposed on an upper surface of the redistribution structure 210. However, depending on the design, the redistribution structure 210 may be formed on a lower surface of the cover insulating layer 240 after the cover insulating layer 240 contacts the insulating frame 14*a*. As such, a method in which the redistribution structure 210 is formed later may be a chip first method.

Referring to FIGS. 1C and 1D, the method of manufacturing a semiconductor package according to an embodiment may include bringing the cover insulating layer 240 contacting and covering at least one semiconductor chip 221, 222, and 223 into contact with the insulating frame 14*a* and the first metal layer 13.

Since the cover insulating layer 240 may contact and cover at least one semiconductor chip 221, 222, and 223, the at least one semiconductor chip 221, 222, and 223 may be protected from the outside and structural stability of the redistribution structure 210 may also be improved.

For example, the cover insulating layer 240 may include a build-up film, and the build-up film may be an Ajinomoto build-up film (ABF). Since the build-up film may be efficiently formed as an insulating layer in a printed circuit board (PCB) manufacturing process, the build-up film may advantageously contact and cover at least one semiconductor chip 221, 222, and 223 in a FO-PLP structure.

In addition, the insulating frame 14*a* may also include a build-up film. Accordingly, as the insulating frame 14*a* contacts the upper surface of the cover insulating layer 240, the insulating frame 14*a* may be efficiently (e.g., without a separate bonding material) bonded to the cover insulating layer 240.

Since a portion 14*p* of the insulating frame 14*a* may overflow to the side of the cover insulating layer 240, the thickness T4 of the insulating frame 14*a* may not substantially affect the total thickness of the semiconductor package. Accordingly, an increase in the total thickness of the semiconductor package according to an embodiment may be effectively suppressed.

For example, the operation of bringing the cover insulating layer 240 into contact with the insulating frame 14*a* and the first metal layer 13 may include bringing the first metal layer 13 and the cover insulating layer 240 into contact with each other by compressing the insulating frame 14*a* protruding relative to a surface (e.g., a lower surface) of the first metal layer 13 facing the cover insulating layer 240 and the cover insulating layer 240. Therefore, even if the thickness T4 of the insulating frame 14*a* is greater than the total thickness of the first and second metal layers 13 and 12, an air gap may not be formed between the first metal layer 13 and the cover insulating layer 240.

The insulating frame 14*a* may contact an upper surface of the cover insulating layer 240, at least one semiconductor chip 221, 222, and 223 may be exposed to the lower surface of the cover insulating layer 240, and the number of layers of the build-up film between the upper and lower surfaces of the cover insulating layer 240 may be one. Since the first metal layer 13 and the cover insulating layer 240 may contact each other, there may not be an interface between the upper surface of the at least one semiconductor chip 221, 222, and 223 and the upper surface of the cover insulating layer.

Accordingly, the cover insulating layer 240 may be formed as a single build-up film layer having a thickness T5 from the upper surface to the lower surface. The thickness T5 may be less than 37.5 μm. Alternatively, the thickness T5 may be less than 30 μm. Alternatively, the thickness T5 may be 22.5 μm or less. The thickness T5 less than 37.5 μm, the thickness T5 less than 30 μm, and the thickness T5 of 22.5 μm or less may be implemented by manufacturing a semiconductor package using the carrier 10*a*-2 including the insulating frame 14*a*, but is not limited thereto.

For example, the thicknesses T1, T2, T3, T4, and T5 may be measured by analysis using at least one of a micrometer, a transmission electron microscopy (TEM), an atomic force microscope (AFM), a scanning electron microscope (SEM), a focused ion beam (FIB) optical microscope, and a surface profiler and may be defined as an average value of the sum of vertical thicknesses for each horizontal position of the corresponding layer.

The core member 260 may surround at least one semiconductor chip 221, 222, and 223, and the cover insulating layer 240 may contact and cover the core member 260 surrounding each of the at least one semiconductor chip 221, 222, and 223.

The core member 260 may have a structure resulting from a FO-PLP structure. For example, the core member 260 may include an insulating material similar to that of a core disposed in the center of a PCB and may have greater rigidity than that of the cover insulating layer 240. The core member 260 may reduce a possibility of warpage of the redistribution structure 210. For example, the core member 260 may be formed by removing a portion (a space in which a semiconductor chip is to be disposed) of a copper clad laminate (CCL).

The semiconductor chips 221, 222, and 223 may be disposed on the upper surface of the redistribution structure 210 by flip-chip bonding. For example, bumps 235 may contact and be disposed on a pad P and may contact and be disposed on connection pads 225 of the semiconductor chips 221, 222, and 223. For example, the connection pad 225 may include a conductive material, such as tungsten (W), aluminum (Al), or copper (Cu), and may be a pad of a bare chip, for example, an aluminum (Al) pad, but may also be a pad of a packaged chip, for example, a copper (Cu) pad according to embodiments.

Non-conductive film layers 231, 232, and 233 may be disposed to surround the bumps 235 between the redistribution structure 210 and the semiconductor chips 221, 222, and 223. The non-conductive film layers 231, 232, and 233 may be referred to as underfill layers, may include a non-conductive polymer, and may include a non-conductive paste (NCP).

Figure 1E:
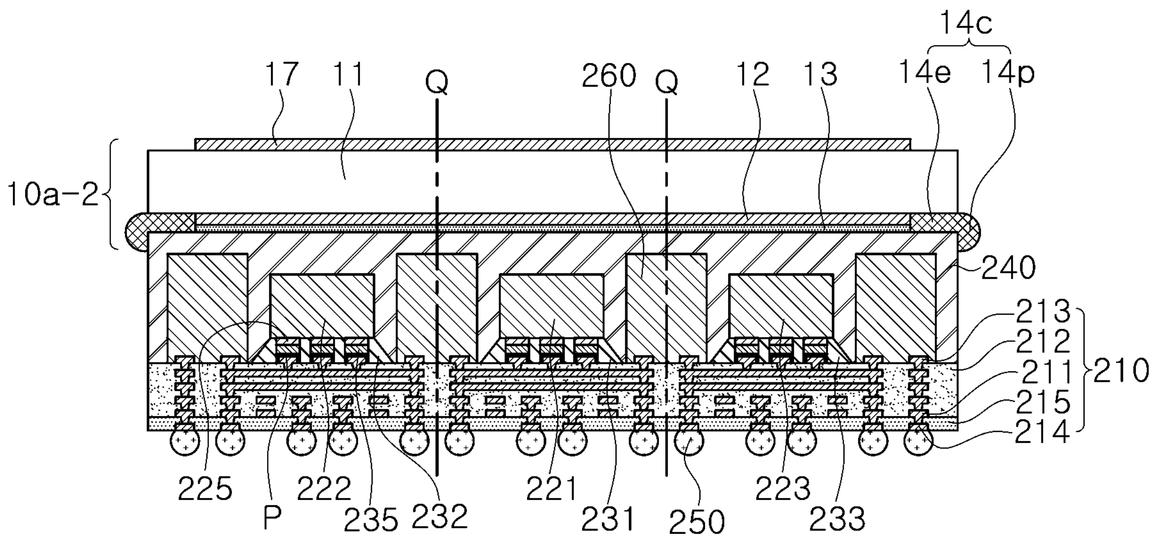
FIGS. 1E and 1F are a cross-sectional view and a plan view, respectively, illustrating an operation of cutting a cover insulating layer in a method of manufacturing a semiconductor package according to an embodiment of the present inventive concept and a semiconductor package according to an embodiment of the present inventive concept.
Figure 1F:
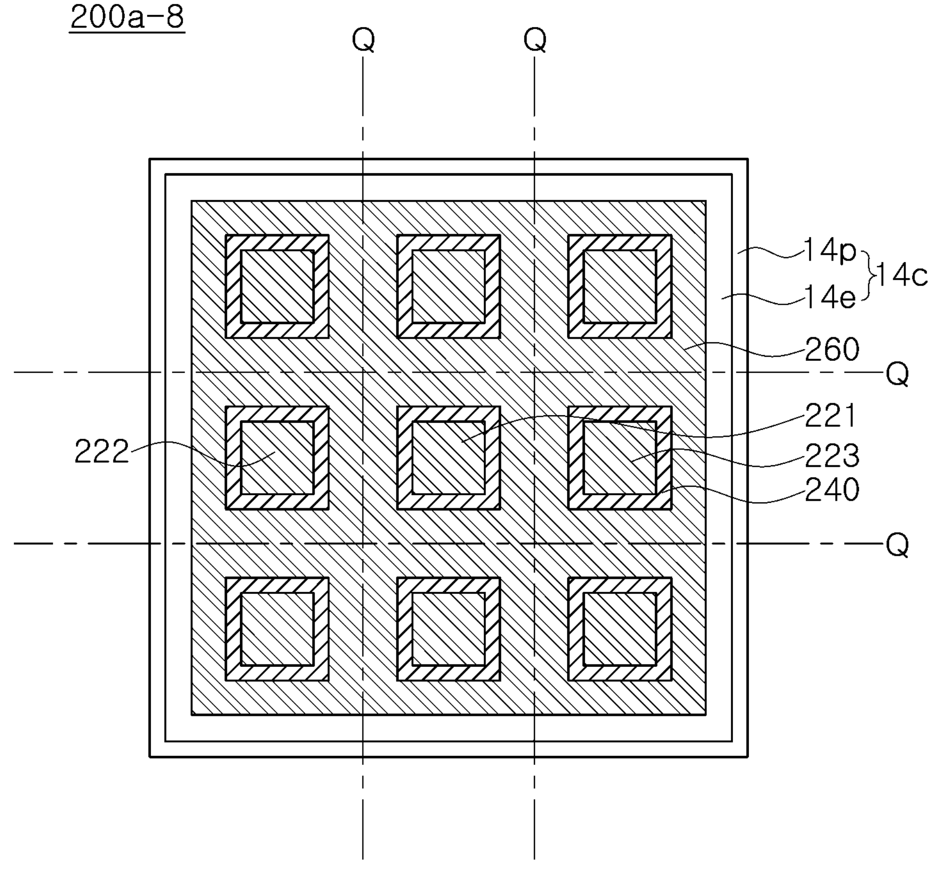
Figure 2A:
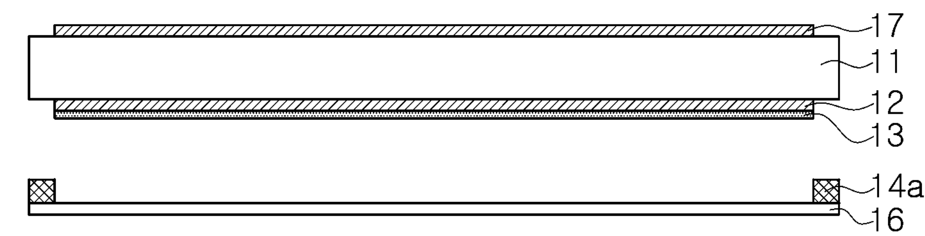
FIGS. 2A to 2E are cross-sectional views illustrating a method of manufacturing a semiconductor package and a structure in which a thickness of an insulating frame of a semiconductor package is changed according to an embodiment of the present inventive concept.
Figure 2B:
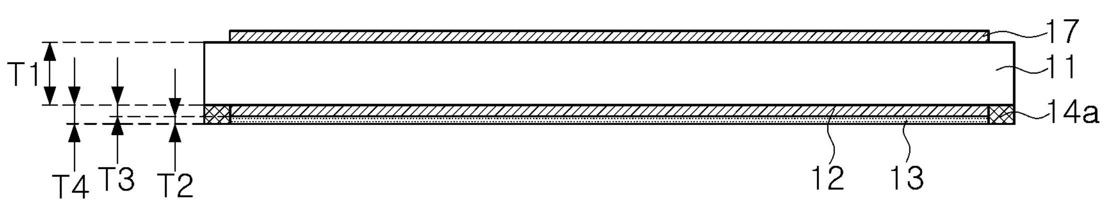
Figure 2C:
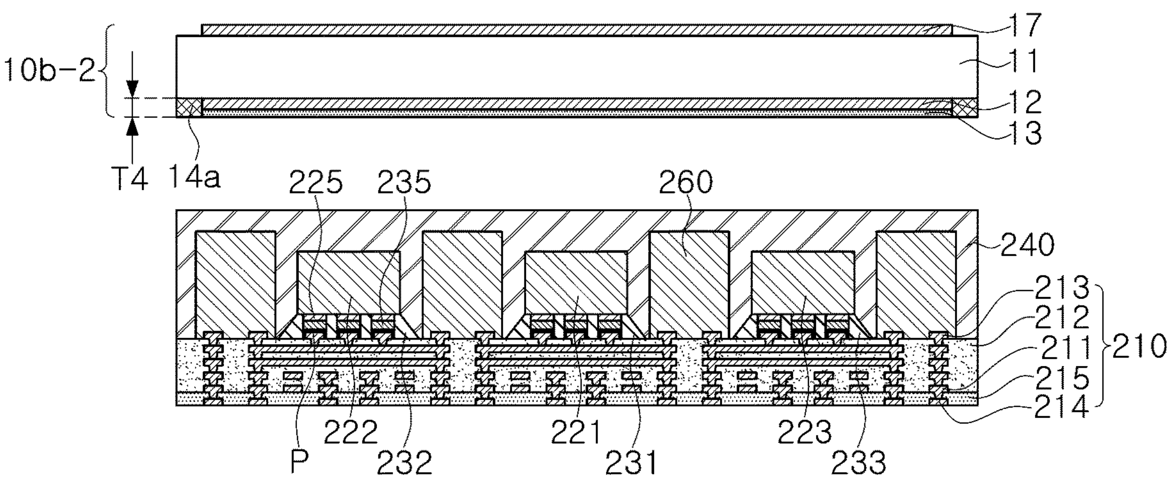
Figure 2D:
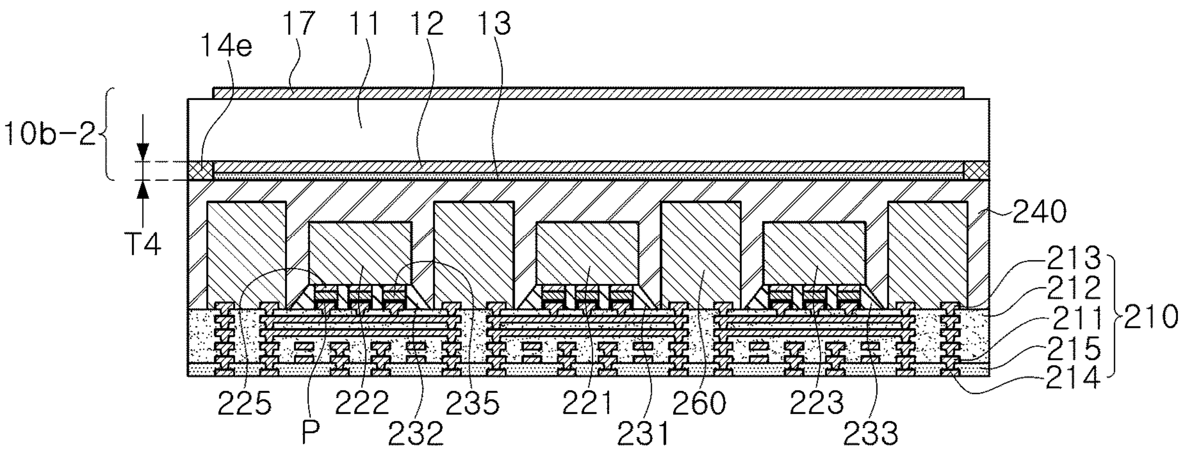
Figure 2E:
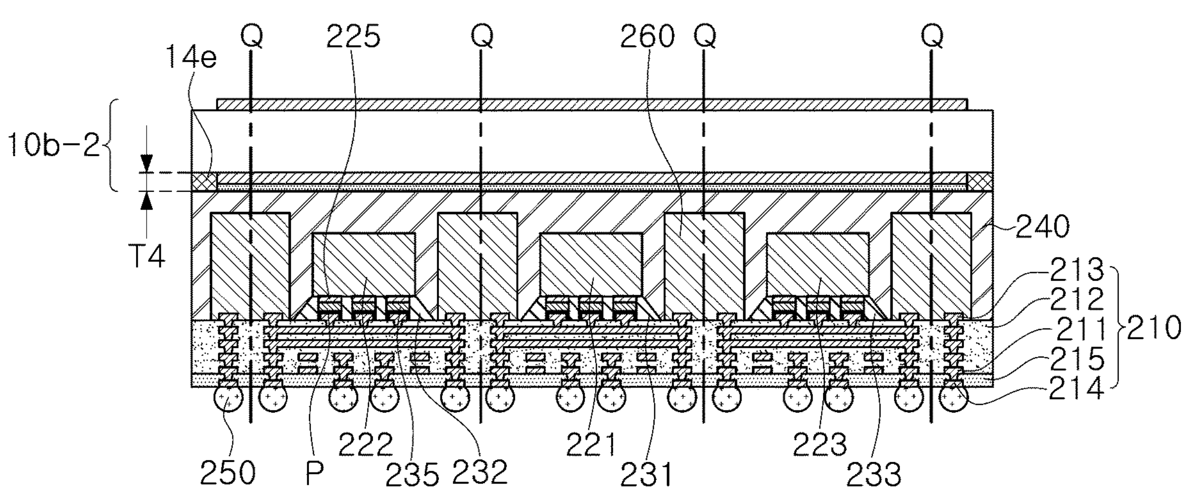

Referring to FIGS. 1E and 1F, the method of manufacturing a semiconductor package according to an embodiment may further include cutting the cover insulating layer 240 after the contacting operation. For example, for vertical cutting of the cover insulating layer 240, a cutting tool or a laser may be focused on a package cutting line Q.

The cover insulating layer 240 of the semiconductor package **200*a*-7 being manufactured may contact and cover the plurality of semiconductor chips 221, 222, and 223, and portions divided from the cover insulating layer 240 of the semiconductor package 200*a*-8 may contact and cover the plurality of semiconductor chips 221, 222, and 223**, respectively. Accordingly, a plurality of semiconductor packages may be collectively manufactured.

Before cutting the cover insulating layer 240, the bumps 250 may be arranged on a lower surface of UBMs 214 on the lower surface of the redistribution structure 210. The semiconductor package manufacturing method according to an embodiment of the present inventive concept may further include, after the contacting operation, separating the carrier substrate 11 from the first metal layer 13 and an insulating bend **14*c*. The insulating bend 14*c* may correspond to the insulating frame 14*a* of FIGS. 1A to 1C. The term "insulating bend" refers to the shape of the insulating material of the insulating frame 14*a* after being compressed, i.e., the insulating bend "bends around" the edge of the cover insulating layer 240 and contacts an outer surface of the cover insulating layer 240. For example, the separating operation may be performed after the bumps 250** are formed, or may be performed before the cutting operation.

Referring to FIGS. 2A to 2E, depending on the design, the thickness T4 of the insulating frame **14*a* of carriers 10*b*-1 and 10*b*-2 may be shorter than the thickness T4 of the insulating frame 14*a* of FIGS. 1A to 1C and may be substantially equal to the sum of the thicknesses T3 and T2 of the first and second metal layers 13 and 12. The shape of the insulating frame 14*e* of the semiconductor packages 200*b*-6 and 200*b*-7 and the semiconductor package 200*b*-8 being manufactured may be substantially the same as that of the insulating frame 14*a* of FIGS. 2A to 2**C.

Figure 3A:
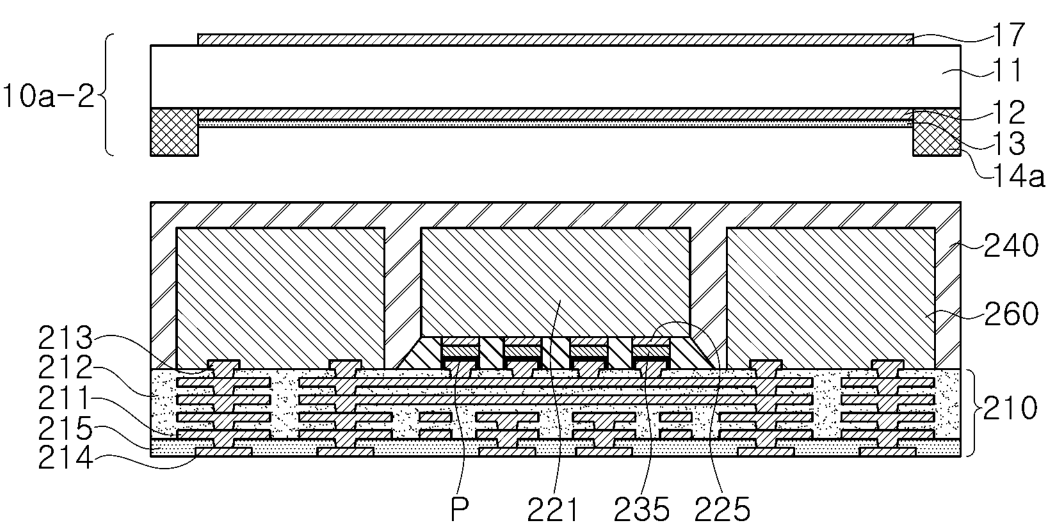
FIGS. 3A to 3C are cross-sectional views illustrating a method of manufacturing a semiconductor package and a structure in which a horizontal size relationship between a carrier of a semiconductor package and a semiconductor package is changed according to an embodiment.
Figure 3B:
Figure 3B:
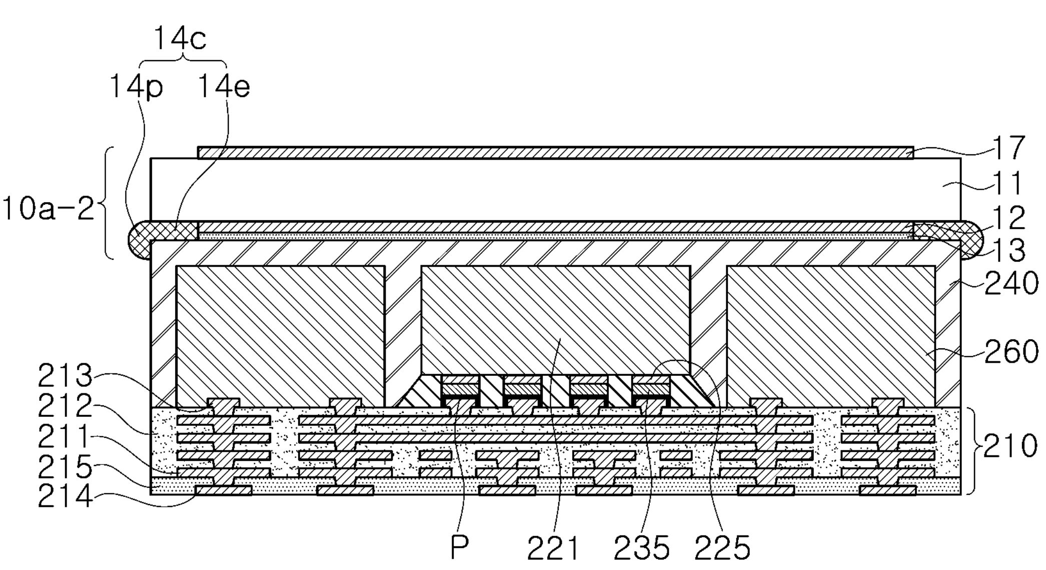
Figure 3C:
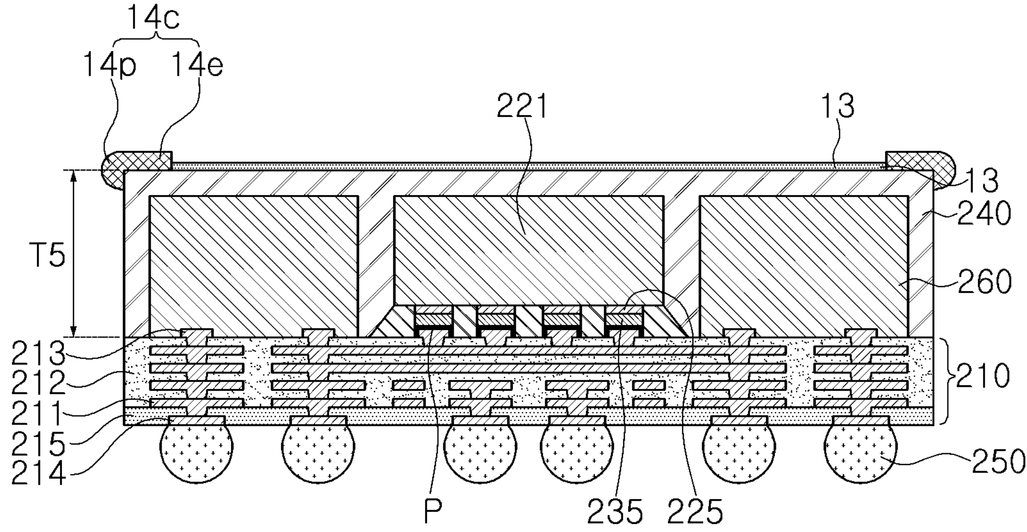

Referring to FIGS. 3A and 3B, the number of semiconductor chips 221 contacted and covered by the cover insulating layer 240 of the semiconductor packages **200*c*-6 and 200*c*-7 being manufactured may be one. When viewed in a vertical direction, the insulating frame 14*a* may surround the semiconductor chip 221. Referring to FIG. 3C, a semiconductor package 200*c*-8 according to an embodiment may have a structure by separating the carrier substrate 11 from the first metal layer 13 and the insulating bend 14*c*, but is not limited thereto. The insulating bend 14*c*** may be formed based on the insulating frame.

Referring to FIG. 3C, the semiconductor package **200*c*-8 according to an embodiment may include the redistribution structure 210, the semiconductor chip 221, and the cover insulating layer 240, and may further include a core member 260**.

The redistribution structure 210 may have a structure in which at least one redistribution layer 211 and at least one redistribution insulating layer 212 are alternately stacked, and may include an interlayer via 213. The interlayer via 213 may vertically connect the redistribution layers 211 and pass through at least a portion of the redistribution insulating layers 212.

The redistribution insulating layers 212 may include an insulating material, for example, a thermosetting resin, such as epoxy resin, or a thermoplastic resin, such as polyimide. For example, the redistribution insulating layers 212 may include a photosensitive insulating material, such as a photo imagable dielectric (PID) resin. Alternatively, the redistribution insulating layers 212 may include a resin mixed with an inorganic filler, for example, ABF. Alternatively, the redistribution insulating layers 212 may include prepreg, flame retardant (FR-4), or bismaleimide triazine (BT). The redistribution insulating layers 212 may include the same or different materials, and boundaries therebetween may not be apparent depending on materials constituting each layer and processes.

The redistribution layers 211 and the interlayer vias 213 may form an electrical path. The redistribution layers 211 may be arranged in a line shape on an X-Y plane, and the interlayer vias 213 may have a cylindrical shape having a side surface inclined upwardly and downwardly to become narrow. The interlayer vias 213 are shown as a filled via structure in which the inside is completely filled with a conductive material, but is not limited thereto. For example, the interlayer vias 213 may have a conformal via shape in which a metal material is formed along an inner wall of the via hole. The redistribution layers 211 and the interlayer vias 213 may include a conductive material, for example, copper (Cu), aluminum (Al), silver (Ag), tin (Sn), gold (Au), nickel (Ni), lead (Pb), titanium (Ti), or alloys thereof.

The redistribution structure 210 may further include under bump metallurgy (UBMs) 214 and the lowermost insulating layer 215. For example, the lowermost insulating layer 215 may be a solder resist, but is not limited thereto.

The semiconductor chip 221 may be disposed on the upper surface of the redistribution structure 210 and electrically connected to at least one redistribution layer 211. For example, the semiconductor chip 221 may include a body portion including a semiconductor material, such as silicon (Si), germanium (Ge), or gallium arsenide (GaAs), and a device layer or an active layer disposed below the body portion and including an integrated circuit (IC). The semiconductor chip 221 may include a logic semiconductor chip and/or a memory semiconductor chip. The logic semiconductor chip may be a microprocessor, for example, a central processing unit (CPU), a graphics processing unit (GPU), a field programmable gate array (FPGA), an application processor (AP), a digital signal processor, a cryptographic processor, a controller, or an application specific integrated circuit (ASIC). The memory semiconductor chip may be a volatile memory, such as dynamic random access memory (DRAM) or static random access memory (SRAM), or a non-volatile memory, such as flash memory.

The semiconductor chip 221 may be disposed on the upper surface of the redistribution structure 210 using a flip-chip bonding method. For example, the bumps 235 may contact and be disposed on the pad P or may contact and be disposed on the connection pad 225 of the semiconductor chip 221. For example, the connection pad 225 may include a conductive material, such as tungsten (W), aluminum (Al), or copper (Cu), and may be a pad of a bare chip, for example, an aluminum (Al) pad, but may also be a pad of a packaged chip, for example, a copper (Cu) pad according to embodiments. The pad P may electrically connect the semiconductor chip 221 and at least one redistribution layer 211 to each other. For example, pad P may be formed in a similar manner to that of UBMs 214 and may include a similar material, but is not limited thereto.

The cover insulating layer 240 may be disposed on the upper surface of the redistribution structure 210 and may contact and cover the side surface of the semiconductor chip 221. For example, the cover insulating layer 240 may be formed of as a single build-up film layer having a thickness less than 37.5 μm (T5 in FIG. 3C) from an upper surface to a lower surface of the cover insulating layer 240. Alternatively, the thickness (T5 in FIG. 3C) of the cover insulating layer 240 from the upper surface to the lower surface may be less than 30 Alternatively, the thickness (T5 in FIG. 3C) of the cover insulating layer 240 from the upper surface to the lower surface may be 22.5 μm or less. A structure in which the thickness of a single build-up film layer contacting and covering the side surface of the semiconductor chip 221 is less than 37.5 less than 30 or equal to or less than 22.5 μm may be implemented by the method of manufacturing a semiconductor package according to an embodiment of the present inventive concept, but not limited thereto.

Alternatively, the semiconductor package 200*c*-8 may include the insulating bend 14*c* disposed to partially contact a portion of an outer surface of the cover insulating layer 240 and to partially contact a portion of an upper surface of the cover insulating layer 240, as illustrated in FIG. 3C. The insulating bend 14*c* may be implemented by the method of manufacturing a semiconductor package according to an embodiment, but is not limited thereto (e.g., the insulating frame 14*a* is compressed during manufacturing so that the insulating material of the insulating frame 14*a* "bends around" the edge of the cover insulating layer 240 and contacts an outer surface of the cover insulating layer 240, as illustrated).

The core member 260 may be disposed on the upper surface of the redistribution structure 210, may surround (i.e., extend around) the semiconductor chip 221, and may contact the cover insulating layer 240. A thickness of a single build-up film layer from the upper surface to the lower surface of the cover insulating layer 240 may be greater than a thickness of the core member 260 and greater than the thickness of the semiconductor chip 221. Accordingly, the cover insulating layer 240 may contact and cover the upper surface of the core member 260 and also contact and cover the upper surface of the semiconductor chip 221.

The cover insulating layer 240 may be configured not to provide an electrical connection path between the upper and lower surfaces of the cover insulating layer 240. For example, a structure extending vertically and including a metal material may not be formed between the upper surface of the cover insulating layer 240 and the upper surface of the semiconductor chip 221, and may not be formed between the cover insulating layer 240 and the upper surface of the core member 260. A package-on-package (PoP) structure may be a structure in which an insulating layer (e.g., a redistribution insulating layer) providing an electrical connection path between an upper surface and a lower surface is disposed above a semiconductor chip, and the insulating layer may not be included in the cover insulating layer 240 and may not be included in the semiconductor package 200*c*-8 according to an embodiment of the present inventive concept.

Referring to FIG. 3C, the semiconductor package 200*c*-8 according to an embodiment may further include at least one of the bumps 250 and the first metal layer 13. Depending on the design, the first metal layer 13 may be removed by an etching process or used as a heat dissipation structure or an electromagnetic shielding structure.

The bumps 250 may contact and be arranged on a lower surface of the UBMs 214 of the redistribution structure 210. For example, the bumps 250 may have a ball or column shape, and may include solder including tin (Sn) or an alloy (Sn—Ag—Cu) including tin (Sn). Since the bumps 250 may have a relatively low melting point compared to other metal materials, the bumps 250 may be connected to and fixed on the UBMs 214 by a thermal compression bonding (TCB) process or a reflow process.

The UBMs 214 may be electrically connected between the interlayer vias 213 and the bumps 250, and may be arranged to face the bumps 250 in a stacking direction (e.g., a vertical direction) of the redistribution structure 210. For example, the UBMs 214 may provide a sufficiently wide lower surface such that a portion of a material of the bumps 250 does not leak sideways when the bumps 250 are formed, and the bumps 250 may contact the wide lower surface of the UBMs 214. Accordingly, the UBMs 214 may be advantageous in reducing contact resistance between the bumps 250 and the redistribution layers 211.

Figure 4A:
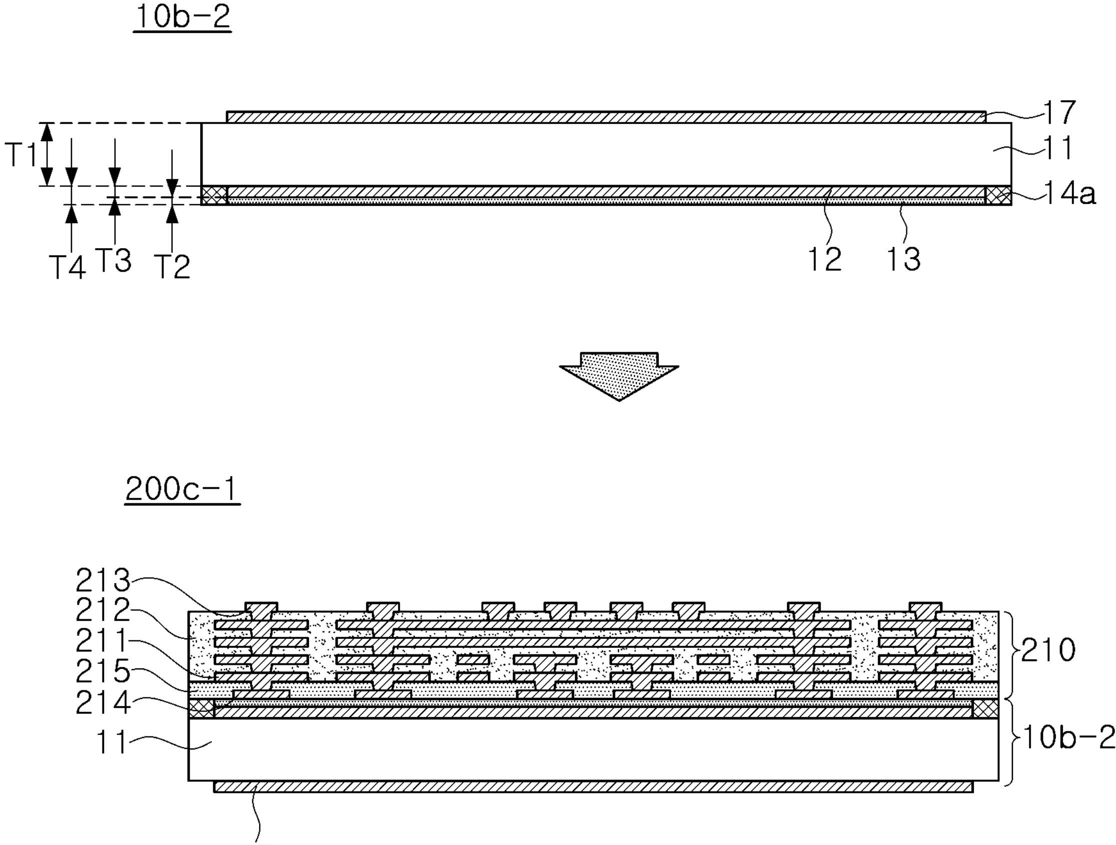
FIGS. 4A to 4C are cross-sectional views illustrating a method of manufacturing a semiconductor package and a process of preparing a cover insulating layer contacting and covering a semiconductor chip of a semiconductor package according to an embodiment of the present inventive concept.

Referring to FIG. 4A, the carrier 10*b*-2 may provide a region necessary for first forming the redistribution structure 210 according to a chip last method. Accordingly, a semiconductor package 200*c*-1 of a first stage may have a structure in which the redistribution structure 210 is formed on the carrier 10*b*-2. The aforementioned chip first method and chip last method may be selectively applied. For example, a structure in which the redistribution layers 211 and the redistribution insulating layers 212 are alternately stacked may be formed using a photolithography method.

Figure 4B:
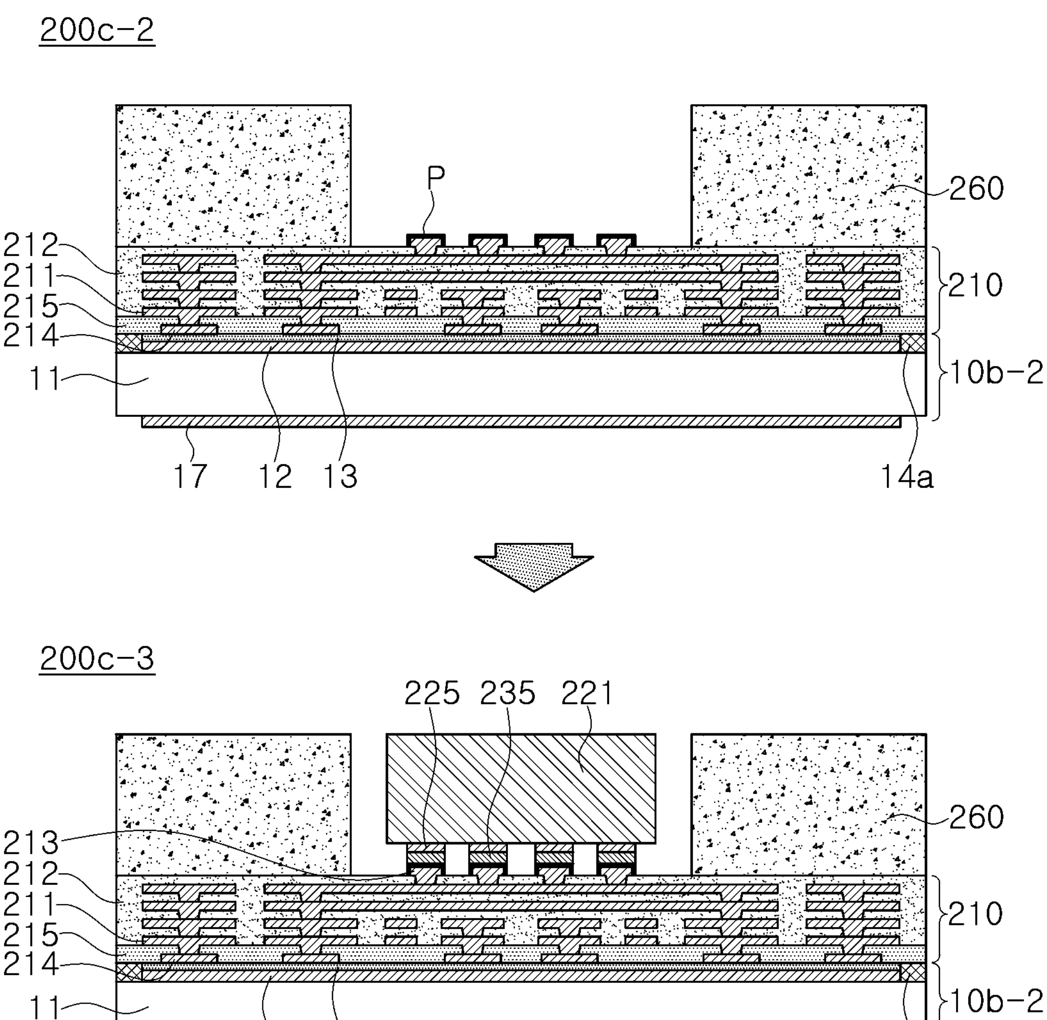

Referring to FIG. 4B, a semiconductor package 200*c*-2 of a second stage may have a structure in which the core member 260 is formed on the upper surface of the redistribution structure 210, and a semiconductor package 200*c*-2 of a third stage 3 may have a structure in which the semiconductor chip 221 is mounted on the upper surface of the redistribution structure 210.

Figure 4C:
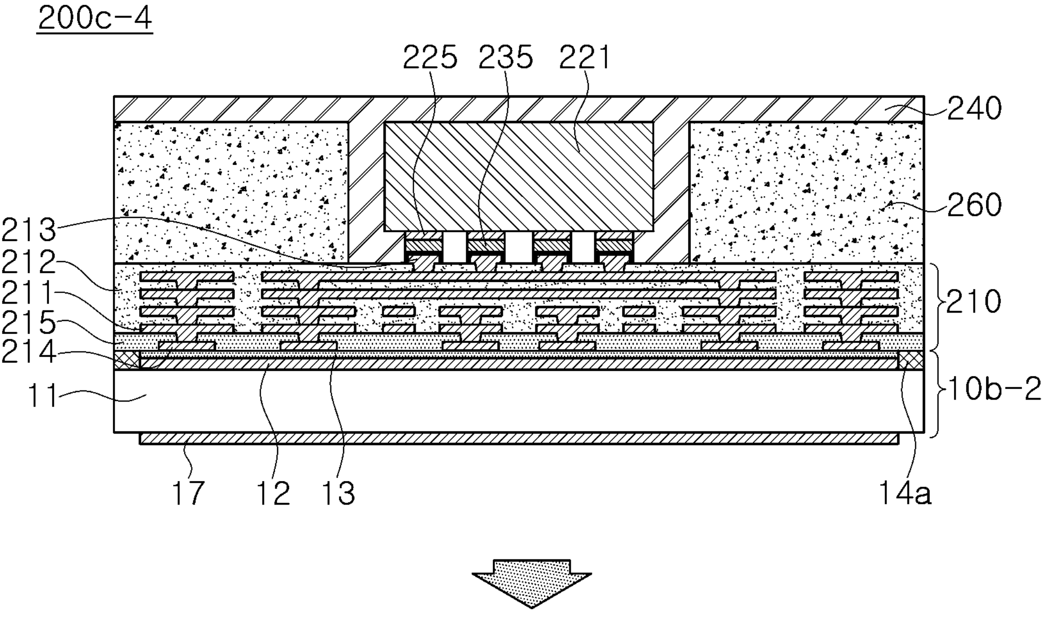
Figure 4C:
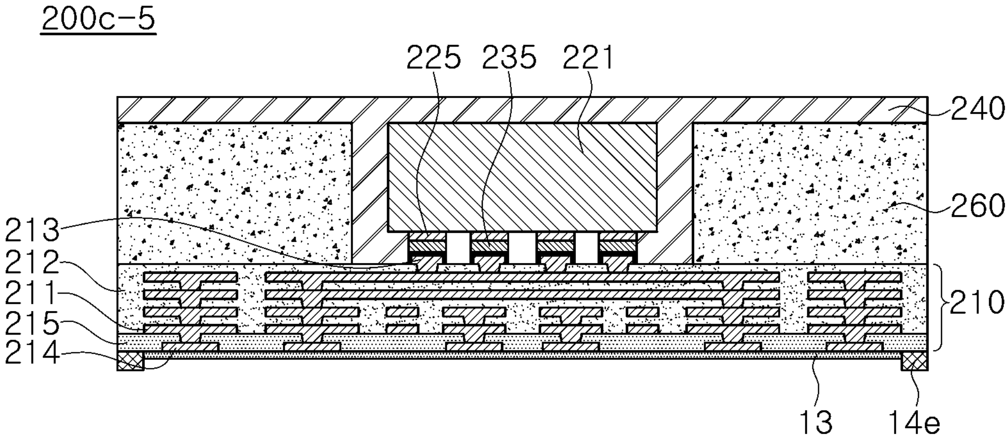

Referring to FIG. 4C, a semiconductor package 200*c*-4 of a fourth stage may have a structure in which the cover insulating layer 240 is formed on the upper surface of the redistribution structure 210, and a semiconductor package 200*c*-5 of a fifth stage may have a structure in which the carrier substrate 11 is separated.

Figure 5:
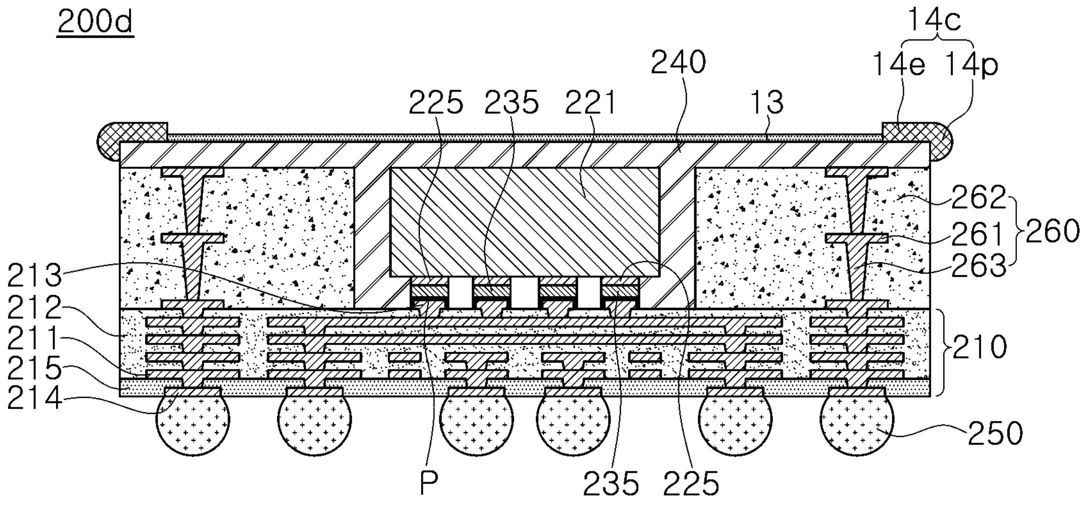
FIG. 5 is a cross-sectional view illustrating a changed structure of a core member of a semiconductor package according to an embodiment.

Referring to FIG. 5, the core member 260 of a semiconductor package 200*d* according to an embodiment may include a core wiring layer 261, a core insulating layer 262, and a core via 263.

For example, the core wiring layer 261 may be disposed on the upper and/or lower surfaces of the core insulating layer 262, may be generally larger (e.g., wider line width, longer pitch) than the redistribution layer 211, and may be implemented in a similar manner to that of forming a wiring of a PCB. The core via 263 may vertically pass through the core insulating layer 262, may be connected to the core wiring layer 261, and may be substantially larger than the interlayer via 213.

The semiconductor package manufacturing method and the semiconductor package according to an embodiment of the present inventive concept may improve efficiency related to a carrier implemented to be resistant to physical situations with respect to an external structure (e.g., adjacent equipment).

While example embodiments have been shown and described above, it will be apparent to those skilled in the art that modifications and variations could be made without departing from the scope of the present inventive concept as defined by the appended claims.

What is claimed is:

1. A semiconductor package, comprising:

a redistribution structure comprising at least one redistribution layer and at least one redistribution insulating layer alternately stacked;

a semiconductor chip on an upper surface of the redistribution structure and electrically connected to the at least one redistribution layer;

a cover insulating layer on the upper surface of the redistribution structure and contacting and covering a side surface of the semiconductor chip, wherein the cover insulating layer is configured as a single build-up film layer; and an insulating bend partially contacting a portion of an outer surface of the cover insulating layer and partially contacting a portion of an upper surface of the cover insulating layer.

2. The semiconductor package of claim 1, further comprising a core member on the upper surface of the redistribution structure, wherein the core member extends around the semiconductor chip and contacts the cover insulating layer.

3. The semiconductor package of claim 2, wherein a thickness of the cover insulating layer is greater than a thickness of the core member and greater than a thickness of the semiconductor chip.

4. The semiconductor package of claim 3, wherein the cover insulating layer is configured not to provide an electrical connection path between an upper and a lower surface of the cover insulating layer.

5. The semiconductor package of claim 4, wherein the single build-up film layer comprises Ajinomoto build-up film (ABF).

6. The semiconductor package of claim 1, wherein the single build-up film layer has a thickness less than 37.5 μm.

7. A semiconductor package, comprising:

a redistribution structure comprising at least one redistribution layer and at least one redistribution insulating layer alternately stacked;

a semiconductor chip on an upper surface of the redistribution structure and electrically connected to the at least one redistribution layer;

a cover insulating layer on the upper surface of the redistribution structure and contacting and covering a side surface of the semiconductor chip; and an insulating bend partially contacting a portion of an outer surface of the cover insulating layer and partially contacting a portion of an upper surface of the cover insulating layer.

8. The semiconductor package of claim 7, wherein the cover insulating layer is configured not to provide an electrical connection path between the upper surface and a lower surface of the cover insulating layer.

9. The semiconductor package of claim 8, further comprising a core member on the upper surface of the redistribution structure, wherein the core member extends around the semiconductor chip and contacts the cover insulating layer.

10. The semiconductor package of claim 9, wherein a thickness of the cover insulating layer is greater than a thickness of the core member and greater than a thickness of the semiconductor chip.

11. The semiconductor package of claim 7, wherein the insulating bend includes a first portion on the upper surface of the cover insulating layer, and a second portion connected to the first portion and bent downward to cover the side surface of the cover insulating layer, and at least a portion of the second portion of the insulating bend is disposed on the side surface of the cover insulating layer.

12. The semiconductor package of claim 11, wherein the cover insulating layer includes a first side surface and a second side surface opposite to the first side surface, and the second portion of the insulating bend is disposed on the first side surface of the cover insulating layer.

13. The semiconductor package of claim 12, wherein the upper surface of the cover insulating layer includes a first area adjacent to the first side surface of the cover insulating layer, and a second area adjacent to the second side surface of the cover insulating layer, and the first portion of the insulating bend is disposed on the first area of the cover insulating layer.

14. The semiconductor package of claim 11, wherein the cover insulating layer has a maximum thickness less than 22.5 μm, and the first portion of the insulating bend has a maximum thickness less than 15.0 μm.

15. The semiconductor package of claim 7, further comprising:

a metal layer on the upper surface of the cover insulating layer.

16. The semiconductor package of claim 15, wherein at least one side surface of the metal layer contacts with the insulating bend.

17. The semiconductor package of claim 15, wherein a level of an upper surface of the metal layer is lower than a level of an upper surface of the insulating bend.

18. The semiconductor package of claim 7, wherein the insulating bend includes a material the same as a material of the cover insulating layer.

19. A semiconductor package, comprising:

a redistribution structure comprising at least one redistribution layer and at least one redistribution insulating layer alternately stacked;

a semiconductor chip on an upper surface of the redistribution structure and electrically connected to the at least one redistribution layer;

a cover insulating layer on the upper surface of the redistribution structure and contacting and covering a side surface of the semiconductor chip, wherein the cover insulating layer is configured as a single build-up film layer, and the cover insulating layer has a maximum thickness less than 37.5 μm from an upper surface to a lower surface of the cover insulating layer; and an insulating bend partially contacting a portion of an outer surface of the cover insulating layer and partially contacting a portion of the upper surface of the cover insulating layer, wherein the insulating bend includes a material same with a material of the cover insulating layer.

20. The semiconductor package of claim 19, further comprising a core member on the upper surface of the redistribution structure, wherein the core member extends around the semiconductor chip and contacts the cover insulating layer.

* * * * *